US008823467B2

(12) United States Patent
Bao

(10) Patent No.: US 8,823,467 B2
(45) Date of Patent: Sep. 2, 2014

(54) BALUN

(75) Inventor: Mingquan Bao, Vastra Frolunda (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 218 days.

(21) Appl. No.: 13/511,513

(22) PCT Filed: Dec. 10, 2009

(86) PCT No.: PCT/EP2009/066795
§ 371 (c)(1), (2), (4) Date: May 23, 2012

(87) PCT Pub. No.: WO2011/069542
PCT Pub. Date: Jun. 16, 2011

(65) Prior Publication Data

US 2012/0262248 A1 Oct. 18, 2012

(51) Int. Cl.
*H03H 5/00* (2006.01)
*H01P 3/08* (2006.01)

(52) U.S. Cl.
USPC .............................................. 333/26; 333/128

(58) Field of Classification Search
USPC ...................... 333/25, 26, 125, 126, 127, 128
See application file for complete search history.

(56) References Cited

FOREIGN PATENT DOCUMENTS

GB 2045005 A 10/1980

*Primary Examiner* — Dean O Takaoka
(74) *Attorney, Agent, or Firm* — Rothwell, Figg, Ernst & Manbeck, P.C.

(57) ABSTRACT

An arrangement (100, 400, 500, 600) comprising a first plate (110, 410, 510, 610) and a second plate (120, 420, 520, 620) at a first distance (di) from each other with an overlap between them. The arrangement also comprises a third (130, 430, 530, 630) and a fourth (140, 440, 540, 640) plate between the first and second plates in said overlap so that the third and fourth plates do not overlap each other. All plates are made of an electrically conducting material, are essentially flat and plane and are separated from each other by a dielectric material. The first plate comprises an input/output port (111, 411, 511, 611), the second plate comprises a ground port (112), and the third and fourth plates comprise an output/input port (131, 141, 431, 441, 531, 541, 551). The arrangement will serve as a power divider, a power combiner or as a balun.

3 Claims, 7 Drawing Sheets

BALUN

CROSS REFERENCE TO RELATED APPLICATION(S)

This application is a 35 U.S.C. §371 National Phase Entry Application from PCT/EP2009/066795, filed Dec. 10, 2009, designating the United States, the disclosure of which is incorporated by reference herein in its entirety.

TECHNICAL FIELD

The present invention discloses a balun.

BACKGROUND

The component known as a passive power divider and/or combiner is one which is widely used in microwave circuits, such as, for example, mixers, power amplifiers, frequency multipliers, etc. When used as a power divider, the component splits an input signal into two or more output signals, and when used as a combiner, combines two or more input signals into one. If it is desired to specify the number of signals which can be combined and/or divide by the component, it can be referred to as an N-way power divider/combiner, i.e. N input signals can be combined into one output signal, and/or one input signal can be split into N output signals.

An obvious desire with components, particularly those used in microwave circuitry, is to make those components as small as possible, so that they can be implemented in, for example, monolithic microwave integrated circuits, MMIC, or in radio frequency integrated circuits, RFIC. In an N-way power divider/combiner, the difficulty to make the component small grows with the factor N.

SUMMARY

The invention discloses a balun comprising a first plate and a second plate which are arranged at a first distance from each other with an overlap between the first and second plates. The arrangement also comprises a third and a fourth plate which are arranged between the first and second plates in the overlap in such a manner that the third and fourth plates do not overlap each other. The first plate comprises an input/output port and the second plate comprises a ground port, and each of the third and fourth plates comprise an output/input port. The arrangement additionally comprises a fifth and a sixth plate, each of which is equipped with an output/input port and which plates are also arranged in the overlap between the first and second plates. In the arrangement, all of said plates are made of an electrically conducting material, are essentially flat and plane and are separated from each other by a dielectric material, and the fifth and sixth plates are arranged to form plate pairs with the third and fourth plates respectively, so that the fifth plate is arranged at a distance from the third plate with a degree of overlap between the plates. The sixth plate is arranged at a distance from the fourth plate with a degree of overlap between the plates.

In embodiments, the fifth plate is arranged in parallel to the third plate. In embodiments, the sixth plate is arranged in parallel to the fourth plate.

BRIEF DESCRIPTION OF THE DRAWINGS

The invention will be described in more detail in the following, with reference to the appended drawings, in which.

DETAILED DESCRIPTION

Figure 1A:
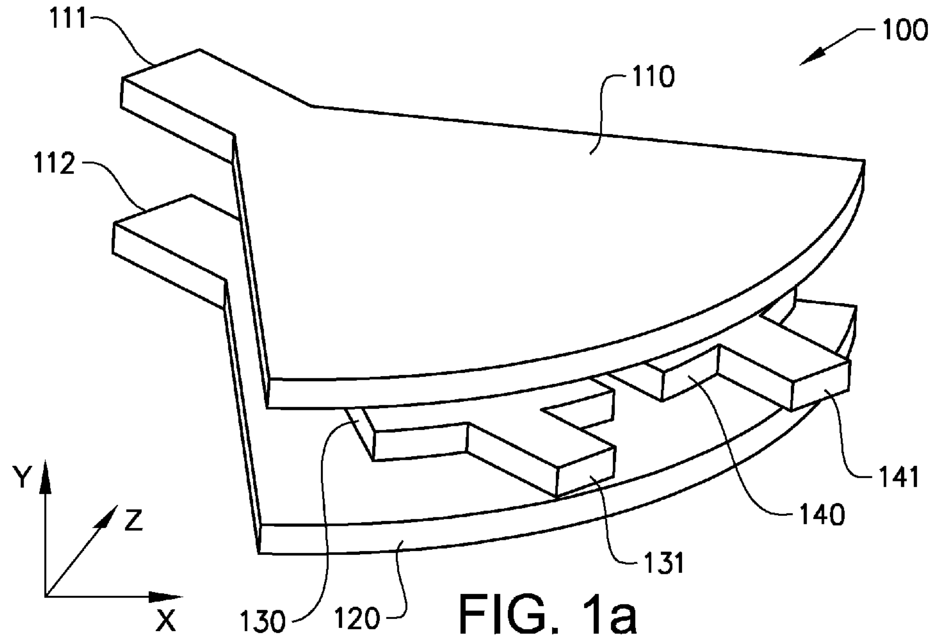
FIGS. 1*a*-1*c* show different views of a first example of an embodiment of the invention.

FIG. 1*a* shows an exploded view of a first embodiment 100 of an arrangement of the invention. As is shown in FIG. 1*a*, the arrangement 100 comprises a first plate 110 and a second plate 120, arranged at a certain distance from each other, with a certain degree of overlap between the first and second plates. In the embodiment shown in FIG. 1*a*, the overlap between the first and second plates is essentially total, but this is merely an example of one embodiment. Also, as is shown in FIG. 1*a*, the first and second plates are of the same shape and size, so that when the two plates are arranged with the essentially total overlap shown in FIG. 1*a*, their positions on the axes indicated as y and x in the coordinate system shown in FIG. 1*a* match each other completely.

As mentioned, the first 110 and second 120 plates are arranged with an overlap between them. According to the invention, there is a third 130 and a fourth 140 plate arranged in this overlap. The third 130 and fourth 140 plates are arranged in this overlap so as not to overlap each other, i.e. in the directions indicated as x and z in the coordinate system in FIG. 1*a* the third and fourth plates are at the closest side by side with each other.

According to the invention, all of the plates, i.e. the first, second, third and fourth plates are made of an electrically conducting material, are essentially flat and plane and they are also separated from each other by a dielectric material. The dielectric material is not explicitly shown in FIG. 1*a* which is an exploded view of the arrangement 100, but can be a variety of different such materials, such as, for example, $SiO_2$, $Al_2O_3$.

In order to accommodate signals to/from the arrangement 100, the arrangement 100 is equipped as follows:

- the first plate 110 comprises an input/output port 111,
- the second plate 120 comprises a ground port 112,
- each of the third 130 and fourth 140 plates comprises an output/input port 131, 141.

By means of the features listed above and shown in FIG. 1, the arrangement 100 will serve as a power divider for signals which are input to the first plate 110 and output from the third 130 and fourth 140 plates, and as a power combiner for signals which are input to the third 130 and fourth 140 plates and output from the first plate 110. Naturally, the second plate 120 which is used as a ground plate in the description given above can be used as a “signal plate”, in which case the first plate 110 is instead used as the “ground plate”.

The invention will from now on primarily be described as a divider. However, this is merely in order to facilitate the description, and it should be pointed out that the arrangement of the invention also functions as a power combiner, inversely to how it divides signals. In other words, if the arrangement is described in the following as, for example, dividing or splitting a in input signal in the ration of 1:2, the same arrangement will also combine input signals in the ratio of 2:1 if the ports used as input for division are used as output ports for combination, and conversely with the ports used as output for division being used as input ports for combination. It should also be pointed out that the arrangement of the invention will be treated in this text as being "loss-less" i.e. as an ideal arrangement.

In the embodiment 100 of FIG. 1*a,* the third and fourth plates are of equal shape and size, which will lead to a division of 50% at each of the output ports 131, 141 of those plates of a signal which is input to the first plate 110 at the port 111.

Figure 1B:
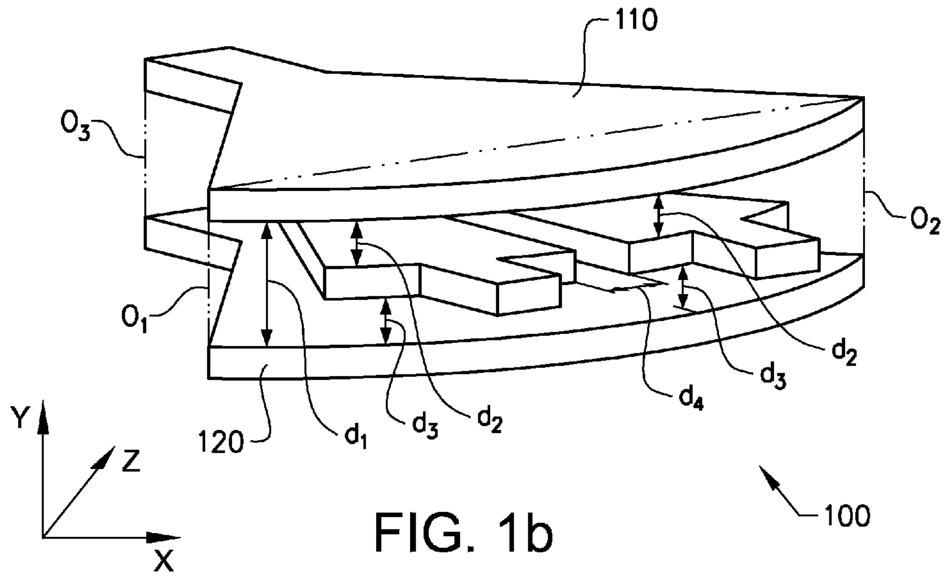

FIG. 1*b* shows the arrangement 100 from a slightly different angle than in FIG. 1*a,* in order to better show the positions of the plates in the arrangement 100. As shown in FIG. 1*b,* the first 110 and second 120 plates are arranged with a distance $d_1$ between them. The first and second plates are shown as being arranged in parallel to each other, i.e. so that the shortest distance between them is a line which is perpendicular to each of the plates, as with the lines which indicate the distance $d_1$. This is a preferred but not necessary embodiment, i.e. the first and second plates do not need to be arranged in parallel to each other in order to achieve the desired function, but this facilitates the manufacturing of the arrangement 100.

In addition, FIG. 1*b* also shows the notion of overlap between the first 110 and second 120 plate: the lines $O_1$, $O_2$ and $O_3$ show that the first and second plates are arranged with an essentially total overlap, i.e. they are arranged "edge to edge" in the dimensions indicated as x and z in the coordinate system shown in FIG. 1*b.*

Also shown in FIG. 1*b* is the distance from the third 130 and fourth 140 plates to the first plate, indicated as $d_2$ in FIG. 1*b.* The distance from the third 130 and fourth 140 plates to the second plate is shown as $d_3$ in FIG. 1*b.* The distances $d_2$ and $d_3$ can, for example, be chosen based on the required impedance at the output ports 131 and 141.

In addition, the third and fourth plates do not need to be placed at the same level in the direction indicated as y in the coordinate system of FIG. 1*b:* in such an alternative embodiment, the third plate 130 would have a distance $d'_3$ to the second plate 120 and a distance $d'_2$ to the first plate 110, while the fourth plate 140 would, for example, have a maintained distance $d_3$ to the second plate 120 and $d_2$ to the first plate 110.

A further feature that can be seen in FIG. 1*b* is the distance $d_4$ between the edges of the third and fourth plates which are the closest to each other: this distance is always greater than zero.

Figure 1C:
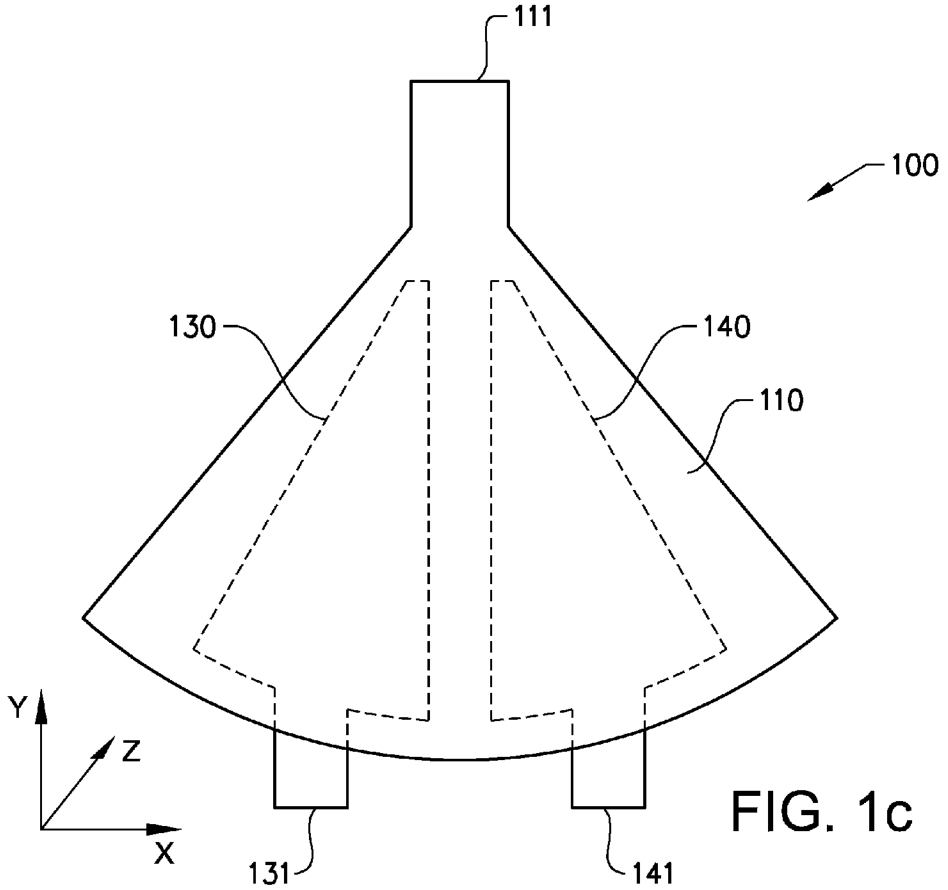

FIG. 1*c* is a top view of the arrangement 100, which shows the positions of the third 130 and fourth plates in the x and z directions. As is also shown, the third 130 and fourth 140 plates are completely overlapped by both the first 110 and the second 120 plates, and the third and fourth plates are arranged symmetrically with respect to the first and second plates, which is a preferred embodiment for an even (1:2/2:1) power divider/combiner.

Figure 2:
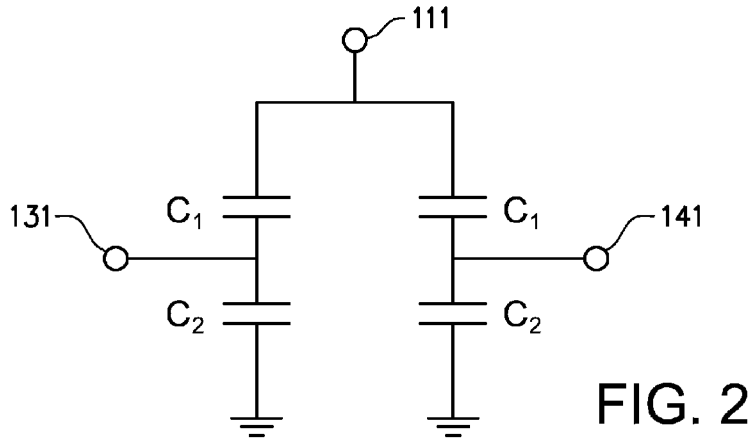
FIG. 2 shows a simplified equivalent circuit schematic for the embodiment of FIGS. 1*a*-1*c*, and FIGS. 3*a* and 3*b* show performance characteristics of the embodiment of FIGS. 1*a*1*c*.

FIG. 2 shows a simplified equivalent circuit diagram for the arrangement 100 shown in FIGS. 1*a*-1*c*. Two "branches" with two serially connected capacitors in each are shown in FIG. 2, the two serially connected capacitors being shown as equal in the two branches, and referred to as $C_1$ and $C_2$ in both branches. The input/output ports 131, 141, of the third and fourth plate can be found between the two capacitors, with one of the input/output ports 131, 141, in each branch. The input/output port 111 of the first plate 110 is shown at a point where the two branches connect to each other.

When the third and fourth plates are of equal size and shape, and are arranged symmetrically as shown in FIGS. 1*a*-1*c,* the two capacitors shown as C2 are equal to each other in capacitance.

In the simplified diagram of FIG. 2, fringe capacitances and losses which are caused by dielectric and metal resistance are not taken into account, since those parameters only have a very limited influence on the performance of the arrangement 100.

The main effect of the arrangement of the invention is thus achieved by means of capacitive coupling between the different plates in the arrangement.

It is known that the capacitance of plate capacitor such as that of those obtained by means of the inventive arrangement is largely determined by the area of plates involved and the separation between the plates, as well as the constant $\in_r$, i.e. the permittivity of the dielectric material which separates the plates from each other.

Usually, the separation of the plates and the permittivity are determined by the manufacture process technologies, which cannot be modified freely. However, the shape of the plates in the inventive arrangement can be used to design the capacitance $C_i$ (i=1,2), with reference to FIG. 3, as well as the impedance of the different input/output ports for a given frequency range.

As an example, the power divider/combiner of FIGS. 1*a*-1*c,* is in one embodiment implemented in GaAs technology. This technology provides four metal layers for interconnection and for building passive components.

Figure 3A:
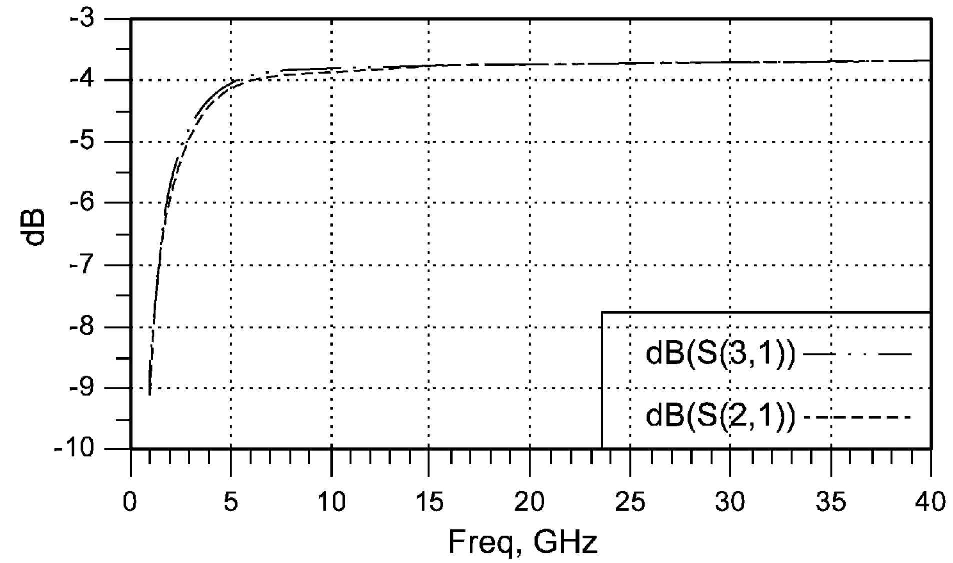
Figure 3B:
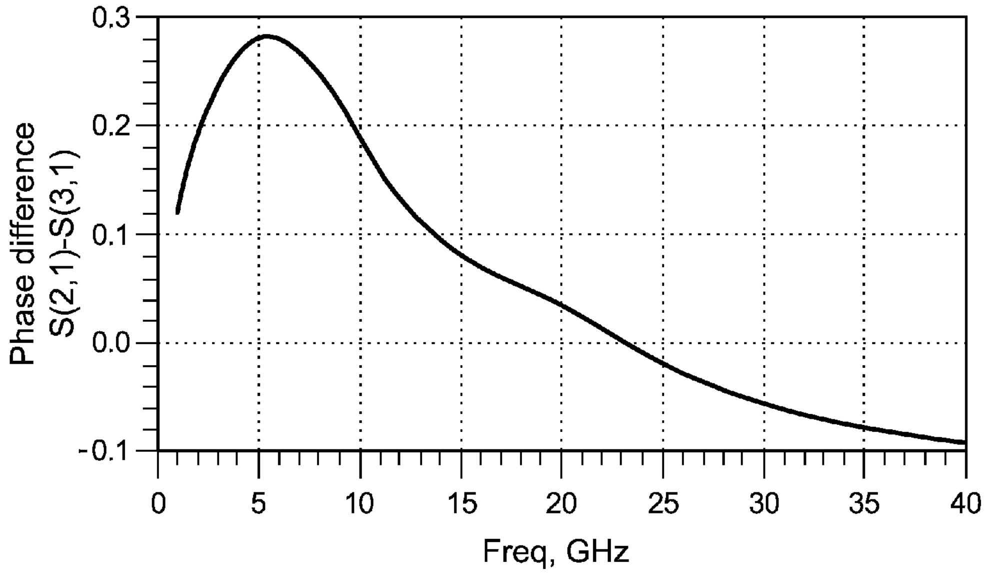

FIG. 3*a* shows the magnitude of S(2,1) which is the forward voltage gain between port 111 and port 131, and also the magnitude of S(3,1) which is the forward voltage gain between port 111 and port 141, while, the phase difference between signals output at the two ports 131, 141, is plotted in FIG. 3*b.* As can be seen, the phase difference is less than 0.2° at frequencies above 10 GHz. Thus, it can be seen that the power divider/combiner of the invention exhibits good performance over a wide frequency bandwidth.

As pointed out previously, the factor in the power division performed by the arrangement of the invention does not need to be 1:2, other factors can also be obtained, suitably by means of using a third and a fourth plate which are of unequal sizes, the difference in size reflecting the desired difference in the power split, so that if the third plate is, for example, twice as large (surface area) as the fourth plate, the split will be such that ⅔ of the input power will go to the third plate and ⅓ to the fourth plate.

It should also be pointed out the shape of metal plates in the inventive arrangement is not limited to the "fan shape" shown in FIGS. 1*a*-1*c,* many other shapes are also possible, and the plates do not need to be of equal shapes either, so long as the conditions regarding distances, overlap etc which are given in this text are fulfilled.

Figure 4:
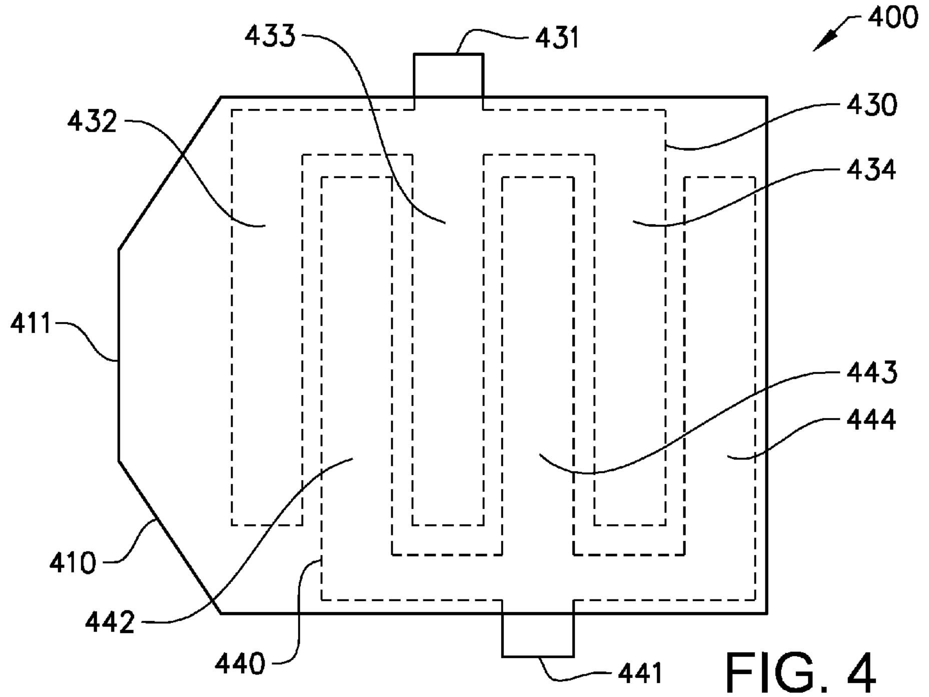
FIG. 4 shows a top view of a second example of an embodiment of the invention.

As one example of different shapes of the plates than the fan shape, as well as of an arrangement in which all of the plates are not of the same shape, FIG. 4 shows a top view of another embodiment 400 of the invention: in this embodiment, the first 411 and the second plate both comprise a rectangular part and a trapezoid part, although the second plate is not visible in the top view of FIG. 4. The third 430 and fourth 440 plates are designed as so called "interdigital microstrip" conductors, i.e. each of the third and fourth plates comprise three "fingers" or digits, 432, 433, 434; 442, 443, 444, with the third and fourth plates being arranged with their digits pointing straight at each other and interlocking with each other, so that a finger from one of the plates is always adjacent to one or two fingers from the other plate.

Figure 5:
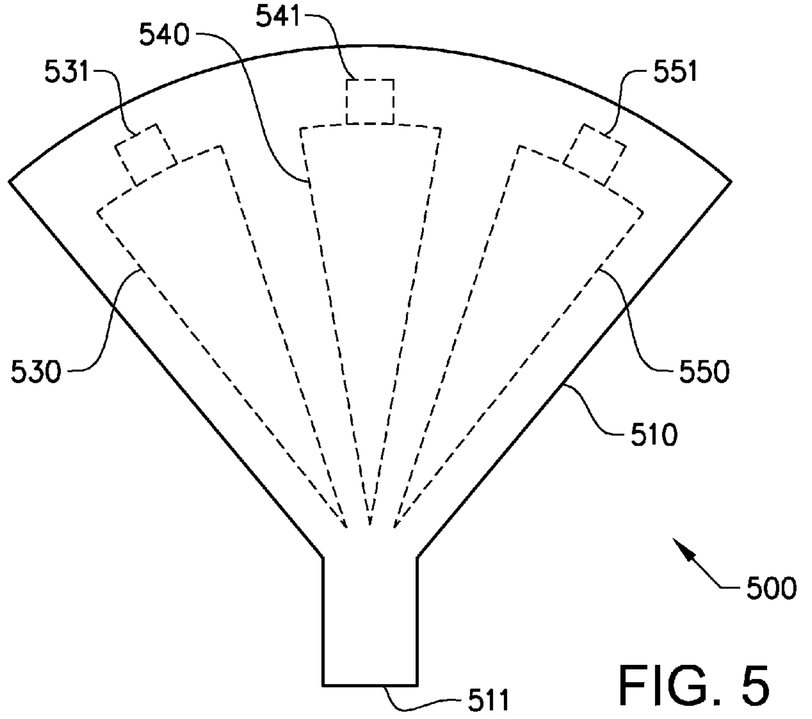
FIG. 5 shows a top view of a third example of an embodiment of the invention.

The power divider/combiner of the invention can also be designed as an N-way divider/combiner by interposing not just a third and a fourth plate between the first and the second plates, but by interposing N plates in the overlap between the first and the second plates, with each of the N plates comprising an output/input port. As one example of this principle, a top view of a 3-way (i.e. N=3) power divider/combiner 500 is shown in FIG. 5: Only the first or "top plate" 510 is visible in FIG. 5, but the embodiment also comprises a second or "bottom" plate 520 of equal size and shape as the plate 510, arranged at a distance from the first plate 510 and separated from it and the other plates in the arrangement 500 by means of a dielectric material, according to the principles explained previously in this document. As shown by means of dashed lines in FIG. 5, the embodiment 500 also comprises a third 530, a fourth 540 and a fifth 550 plate arranged between the first plate 510 and the second plate 520, in the overlap between those plates, and suitably at the same distances from them. In similarity to the embodiments described previously in this text, all of the plates in the embodiment 500 are separated from each other by a dielectric material.

Since the third 530, fourth 540, and fifth 550 plates in the embodiment 500 are, as indicated in FIG. 5, all of essentially the same size and shape the splitting/dividing function of the arrangement 500 is equal, i.e. a signal which is input to the first plate 510 is split into three equal parts to the third 530, fourth 540, and fifth 550 plates. In order to access the plates of the arrangement 500, the first plate 510 is equipped with an input/output port 511, and the third 530, fourth 540, and fifth 550 plates are all equipped with one output/input port each, shown as 531, 541, 551, respectively, in FIG. 5. The (not shown) second plate 520 is also equipped with an output/input port, in order to enable a ground connection. Naturally, the first 510 and second 520 plates may be reversed regarding which of them is used as a ground plate and which of them that is used as a signal plate.

Figure 6:
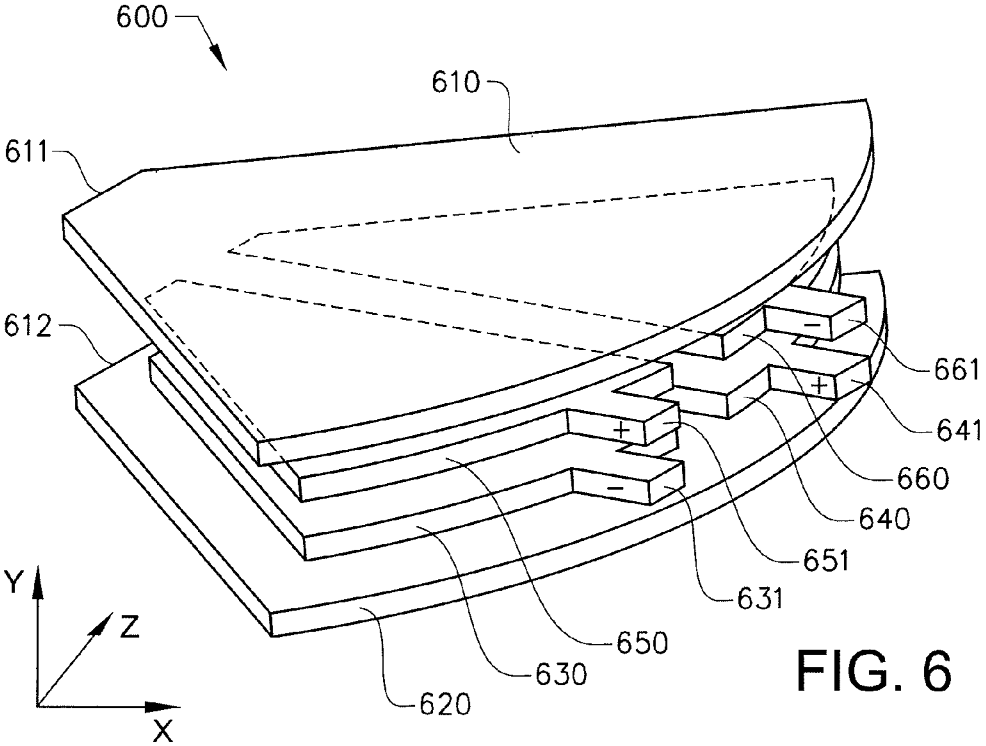
FIG. 6 shows a view of a fourth example of an embodiment of the invention.

In a further embodiment, the arrangement of the invention can also be used as a balun, i.e. it can convert signals that are balanced about ground to signals that are unbalanced and vice versa. An embodiment 600 which can serve as a balun is shown in FIG. 6: a basic principle of an inventive arrangement which can serve as a balun is that the arrangement comprises (at least) two pairs of plates between (in the overlap) the first 610 and second 620 plate. Thus, the embodiment 600 comprises a fifth plate 650 and a sixth plate 660.

Thus, in the embodiment 600, there is a first pair of plates 630, 650, and a second pair 640, 660 of plates, all made of an electrically conducting material and separated from each other by means of a dielectric material. Preferably, in the embodiment 600, the plate pairs, i.e. the first pair comprising plates 630 and 650 and the second pair comprising plates 640 and 660 are arranged so as to give the arrangement 600 symmetry in the directions shown as x, y and z in the coordinate system in FIG. 6, but other configurations are also possible, as will be elaborated upon later in this text.

The first plate 610 is equipped with an input/output port 611, and the second plate is equipped with an input/output port 612. In the plate pairs, each plate is equipped with an output/input port, shown as 631, 651, 641, 661 in FIG. 6.

The function of the balun 600 is as follows: a signal which is input to the first plate 610 via the input/output port 611 is output as two signals, a first output signal between ports 631 and 651 and a second output signal between ports 641 and 661. There will be a 180 degree phase difference between the first and second signals. If the plates in the pairs are all of equal size and shape and have an equal degree of overlap with the first 610 and second 620 plates, the power of the first and second signals will be equal, i.e. the input signal will be divided into two output signals of equal power and with a phase difference of 180 degrees between them. This also means that the power division between the output signals can be influenced by altering, for example, the size of the plates in the two pairs. In order to further illustrate the fact that there is a 180-degree phase difference between the signals which are output at the ports 631, 651 and 661, 641, signs of "+" and "−" are shown at or close to those ports.

Figure 7:
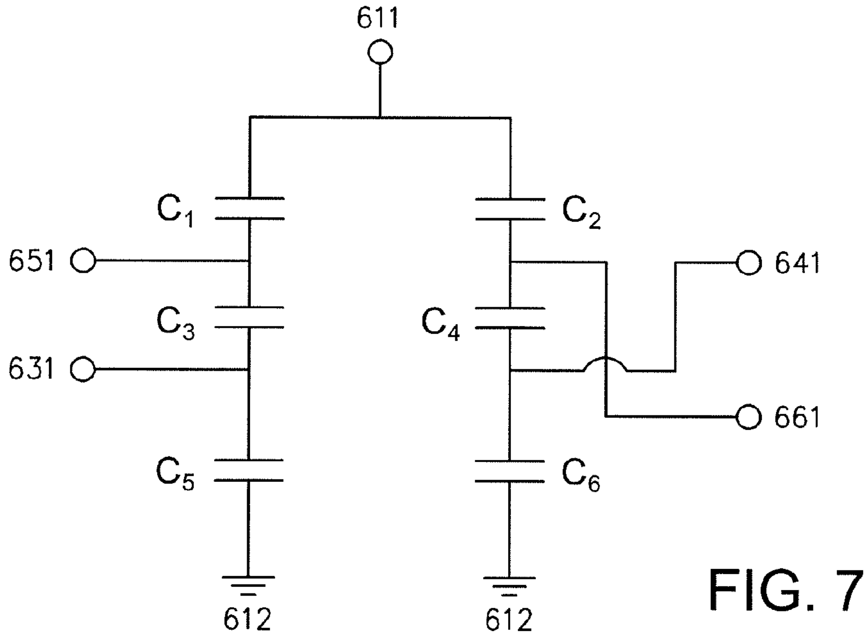
FIG. 7 shows a simplified equivalent circuit schematic for the embodiment of FIG. 6, and FIGS. 8*a* and 8*b* show performance characteristics of the embodiment of FIG. 6.

A simplified diagram of an equal circuit to the balun 600 of FIG. 6 is shown in FIG. 7. As shown, the balun 600 can be simplified into a circuit with two branches of three serially connected capacitors in each branch, with the port 611 at a point where the two branches come together. The capacitors in the first branch are shown as $C_1$, $C_3$, $C_5$, and in the second branch they are shown as $C_2$, $C_4$, $C_6$. The capacitors $C_1$-$C_6$ can be said to equal the capacitances between the following plates:

| Capacitor | Plates |
|---|---|
| $C_1 = \epsilon_r\epsilon_0 A/d$ | 610 and 650 |
| $C_3 = \epsilon_r\epsilon_0 A/d$ | 650 and 630 |
| $C_5 = \epsilon_r\epsilon_0 A/d$ | 630 and 620 |
| $C_2 = \epsilon_r\epsilon_0 A/d$ | 610 and 660 |
| $C_4 = \epsilon_r\epsilon_0 A/d$ | 660 and 640 |
| $C_6 = \epsilon_r\epsilon_0 A/d$ | 640 and 620 |

The magnitude (i.e. capacitance) of each capacitor $C_n$ above can be expressed as $C_n = \in_r \in_0 A/d$, where:

- A is the area of overlap of the two plates which form the capacitor Cn,
- $\in_r$ is the dielectric constant of the dielectric material which separates the two plates,
- $\in_0$ is the permittivity of free space, $\in_0 = 8.854\times10^{-12}$ F/m
- d is the separation between the two plates.

Figure 8A:
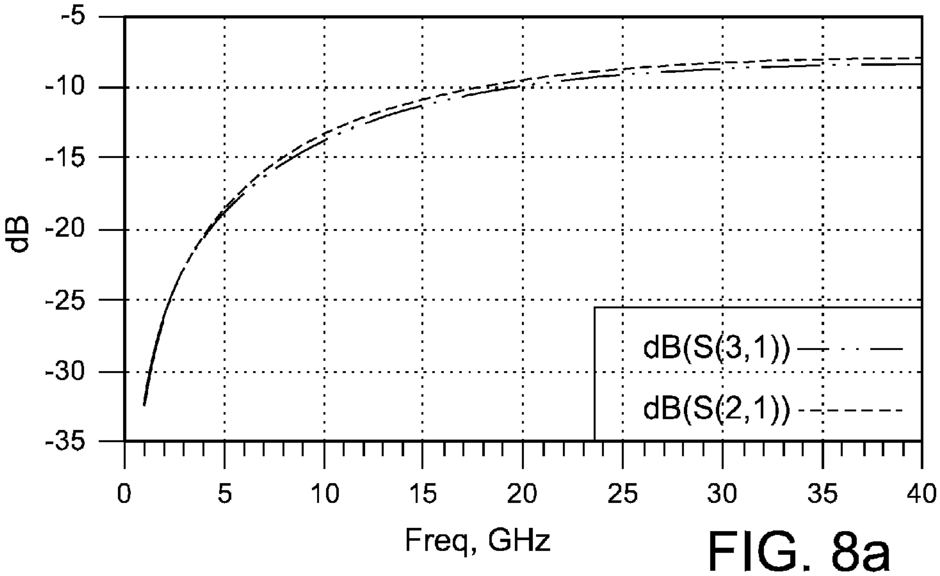

FIG. 8*a* shows the magnitudes of S(2,1) which is the forward voltage gain between ports 611 and 651 and S(3,1) which is the forward voltage gain between ports 611 and 641 in the arrangement 600 of FIG. 6. As can be seen, the two curves are almost identical, which means that the magnitude of the outputs at the two pairs of ports are almost equal, which is highly desirable.

Figure 8B:
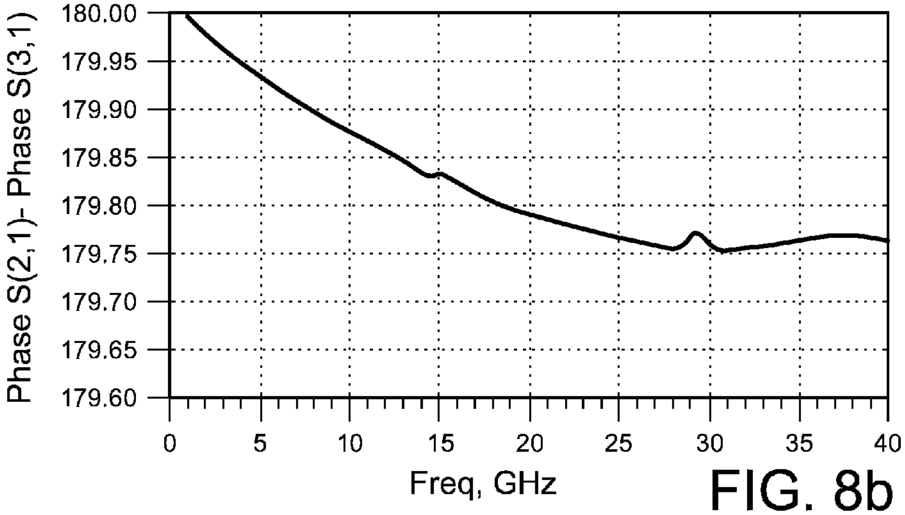

FIG. 8*b* shows the phase difference between the output signals at the two pairs of ports in the arrangement 600. As can be seen in this diagram, the phase difference is 180 degrees or very close to 189 degrees over a frequency range of 0-40 GHz, which is also a very desirable characteristic.

Regarding the size of the balun 600 of FIG. 6, in one embodiment it has been manufactured with a size of 129*104 $\mu m^2$ in GaAs MMIC technology.

Figure 9:
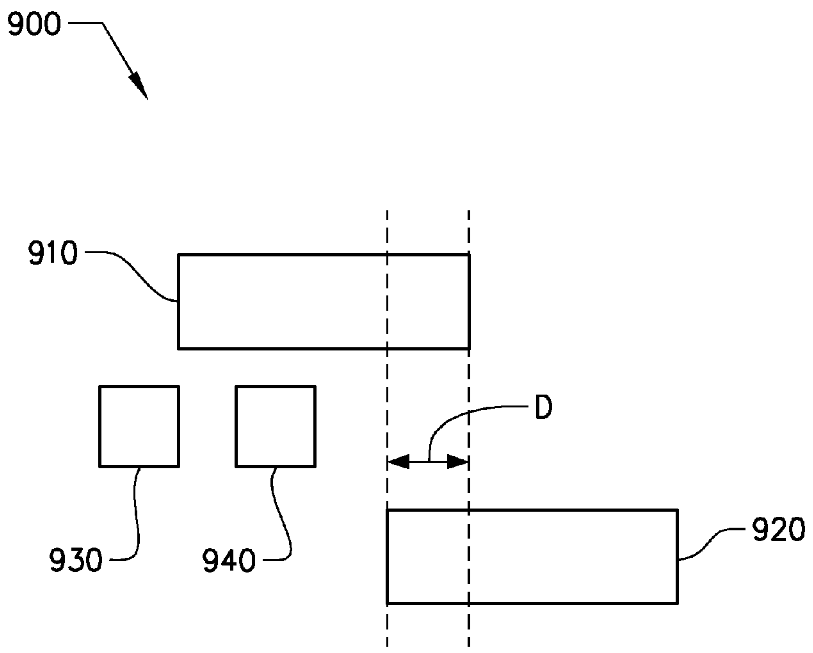
FIG. 9 illustrates a principle of the invention.

FIG. 9 further illustrates the notion of "overlap" between the first and second plates in an arrangement of the invention: a symbolic arrangement 900 is shown in FIG. 9, in which a first 910 and a second 920 plate overlap each other by a certain margin D, as indicated in FIG. 9 by means of dashed lines and an arrow. It is within this overlap that at least some portion of a third 930 and a fourth 940 plate must be arranged in order to obtain the desired capacitive coupling to the first and second plates, thus obtaining the desired effect of the arrangement. Naturally, the best function is obtained when there is a total overlap, i.e. when both of the third and fourth (and other intermediate plates as well, as shown in the examples of FIGS. 5 and 6) plates are within the overlap between the first and second plates. The third and fourth plates are shown as being parallel to the first and second plates, which however is only an example of a preferred embodiment and not a necessity.

As will have been realized, the power divider/combiner and balun of the invention has a number of attractive features, such as, for example:

The effect of the invention is realized by means of (preferably parallel) metal plates, while, prior-art arrangements are usually based on transmission lines, For a power divider, the input signal is added between top and bottom plates, while output signals are taken from middle plates; and vice versa for power combiner.

The "middle plate" i.e. the third, fourth, etc plates can be split in various ways, by means of which the power divider/combiner or balun has a number of attractive features, for instance:

different dividing ratio;

N-way division/combination, where N can be chosen from a wide range;

By utilizing two middle layers, the power divider can deliver two signals with 180° anti-phase, i.e. act as a balun.

Some other examples of advantages of the invention are:

The power divider/combiner and balun of the invention features a highly compact size, due to the use of plates instead of transmission lines, The flexibility to build different types of power dividers/combiners, including baluns, By changing the metal plates' shape and area, impedance transform between input and output ports can be achieved, The proposed power divider/combiner and balun can operate within a wide frequency bandwidth.

Finally, it should be pointed out the proposed power divider/combiner and balun of the invention can be implemented not only in MMIC, monolithic microwave integrated circuits, or RFIC, radio frequency integrated circuits, but also in carriers of circuits, such as, for instance, in PCBs, Printed Circuit Boards, and LTCC circuits, Low Temperature Co-fired Ceramic circuits.

The invention is not limited to the examples of embodiments described above and shown in the drawings, but may be freely varied within the scope of the appended claims.

The invention claimed is:

1. An arrangement (100, 400, 500, 600) comprising a first plate (110, 410, 510, 610) and a second plate (120, 420, 520, 620) which are arranged at a first distance ($d_1$) from each other with an overlap (D) between said first and second plates, the arrangement being characterized in that it also comprises a third (130, 430, 530, 630) and a fourth (140, 440, 540, 640) plate which are arranged between said first and second plates in said overlap (D) in such a manner that the third and fourth plates do not overlap each other, in which arrangement all of said plates are made of an electrically conducting material, are essentially flat and plane and are separated from each other by a dielectric material, with the first plate comprising an input/output port (111, 411, 511, 611), the second plate comprising a ground port (112), and each of the third and fourth plates comprising an output/input port (131, 141, 431, 441, 531, 541, 551), by means of which the arrangement will serve as a power divider for signals which are input to the first plate and output from the third and fourth plates, and as a power combiner for signals which are input to the third and fourth plates and output from the first plate.

2. The arrangement (100, 400, 500, 600) of claim 1, in which the first (110, 410, 510, 610) and second (120, 420, 520, 620) plates are of equal size and shape, are arranged in parallel to each other, i.e. so that the shortest distance ($d_1$) between the two plates is a line which is perpendicular to the plates, and are arranged with an essentially total overlap of each other.

3. The arrangement (100, 400, 500, 600) of claim 1 or 2, in which the third (130, 430, 530, 630) and fourth (140, 440, 540, 640) plates are of equal size and shape, and are arranged at the same second distance from the first (110, 410, 510, 610) plate and/or at the same third distance from the second (120, 420, 520, 620) plate.

* * * * *

UNITED STATES PATENT AND TRADEMARK OFFICE

CERTIFICATE OF CORRECTION

PATENT NO. : 8,823,467 B2
APPLICATION NO. : 13/511513
DATED : September 2, 2014
INVENTOR(S) : Bao It is certified that error appears in the above-identified patent and that said Letters Patent is hereby corrected as shown below:

In the Claims

In Column 8, Lines 6-25, in Claim 1, delete "An arrangement (100, 400, 500, 600) comprising a first plate (110, 410, 510, 610) and a second plate (120, 420, 520, 620) which are arranged at a first distance ($d_1$) from each other with an overlap (D) between said first and second plates, the arrangement being characterized in that it also comprises a third (130, 430, 530, 630) and a fourth (140, 440, 540, 640) plate which are arranged between said first and second plates in said overlap (D) in such a manner that the third and fourth plates do not overlap each other, in which arrangement all of said plates are made of an electrically conducting material, are essentially flat and plane and are separated from each other by a dielectric material, with the first plate comprising an input/output port (111, 411, 511, 611), the second plate comprising a ground port (112), and each of the third and fourth plates comprising an output/input port (131, 141, 431, 441, 531, 541, 551), by means of which the arrangement will serve as a power divider for signals which are input to the first plate and output from the third and fourth plates, and as a power combiner for signals which are input to the third and fourth plates and output from the first plate." and
insert -- A balun comprising a first plate and a second plate which are arranged at a first distance ($d_1$) from each other with an overlap between said first and second plates, the balun also comprising a third plate and a fourth plate which are arranged between said first and second plates in said overlap in such a manner that the third and fourth plates do not overlap each other, with the first plate comprising an input/output port, the second plate comprising a ground port, and each of the third and fourth plates comprising an output/input port, the balun additionally comprising a fifth plate and a sixth plate, each of which is equipped with an output/input port and which plates are also arranged in said overlap between the first and second plates, wherein all of said plates are made of an electrically conducting material, are substantially flat and plane and are separated from each other by a dielectric material, and wherein said fifth and sixth plates are arranged to form plate pairs with the third and fourth plates respectively, the fifth plate arranged at a distance from the third plate with a degree of overlap between the plates, and the sixth plate arranged at a distance from the fourth plate with a degree of overlap between the plates. --, therefor.

Signed and Sealed this
Twenty-fifth Day of August, 2015

Michelle K. Lee

Michelle K. Lee
*Director of the United States Patent and Trademark Office*

In Column 8, Lines 26-32, in Claim 2, delete "The arrangement (100, 400, 500, 600) of claim 1, in which the first (110, 410, 510, 610) and second (120, 420, 520, 620) plates are of equal size and shape, are arranged in parallel to each other, i.e. so that the shortest distance ($d_1$) between the two plates is a line which is perpendicular to the plates, and are arranged with an essentially total overlap of each other." and
insert -- The balun of claim 1, wherein the fifth plate is arranged in parallel to the third plate. --, therefor.

In Column 8, Lines 33-38, in Claim 3, delete "The arrangement (100, 400, 500, 600) of claim 1 or 2, in which the third (130, 430, 530, 630) and fourth (140, 440, 540, 640) plates are of equal size and shape, and are arranged at the same second distance from the first (110, 410, 510, 610) plate and/or at the same third distance from the second (120, 420, 520, 620) plate." and
insert -- The balun of claim 1, wherein the sixth plate is arranged in parallel to the fourth plate. --, therefor.